US012798229B2

(12) United States Patent
Sugahara

(10) Patent No.: US 12,798,229 B2
(45) Date of Patent: Nov. 17, 2026

(54) PRINTING PROCESS ASSISTANCE SYSTEM

(71) Applicant: YAMAHA HATSUDOKI KABUSHIKI KAISHA, Iwata (JP)

(72) Inventor: Kazuyuki Sugahara, Shizuoka (JP)

(73) Assignee: YAMAHA HATSUDOKI KABUSHIKI KAISHA, Iwata (JP)

( * ) Notice: Subject to any disclaimer, the term of this patent is extended or adjusted under 35 U.S.C. 154(b) by 0 days.

(21) Appl. No.: 19/114,723

(22) PCT Filed: Oct. 5, 2022

(86) PCT No.: PCT/JP2022/037307
§ 371 (c)(1),
(2) Date: Mar. 24, 2025

(87) PCT Pub. No.: WO2024/075223
PCT Pub. Date: Apr. 11, 2024

(65) Prior Publication Data

US 2026/0124831 A1 May 7, 2026

(51) Int. Cl.
*B41F 33/00* (2006.01)
*B41F 15/36* (2006.01)
(Continued)

(52) U.S. Cl.
CPC ............ *B41F 35/005* (2013.01); *B41F 15/36* (2013.01); *B41F 33/0036* (2013.01);
(Continued)

(58) Field of Classification Search
CPC .................... B41F 15/36; B41F 35/005; B41F 35/330036; B41P 2215/30; B41P 2235/21;
(Continued)

(56) References Cited

U.S. PATENT DOCUMENTS

2012/0201587 A1 8/2012 Kato et al.

FOREIGN PATENT DOCUMENTS

JP 2002-019071 A 1/2002
JP 2008-117975 A 5/2008
(Continued)

OTHER PUBLICATIONS

International Search Report issued in PCT/JP2022/037307; mailed Nov. 29, 2022.

*Primary Examiner* — Christopher E Mahoney
*Assistant Examiner* — Marissa Ferguson-Samreth
(74) *Attorney, Agent, or Firm* — Studebaker Brackett PLLC

(57) ABSTRACT

A printing process assistance system includes a printing part that executes a printing process of printing a paste material onto a board, and a cleaning process of cleaning a lower surface of the mask a predetermined number of cleaning times at a predetermined cleaning interval; a control part that controls an operation in each of the printing process and the cleaning process; an inspection part that inspects a level of a smudge of the paste material on the board subjected to the printing process; and an information output part that outputs, when a result of the inspection shows continual smudge occurrence, assistive information to reduce the smudge to a destination which is at least one of the control part or a notification part configured to notify an operator of information. The information output part outputs information to increase a frequency of cleaning processes as the assistive information.

14 Claims, 8 Drawing Sheets

(51) Int. Cl.

| | |
|---|---|
| ***B41F 35/00*** | (2006.01) |
| ***H05K 3/12*** | (2006.01) |
| ***H05K 3/3485*** | (2026.01) |

(52) U.S. Cl.
CPC ......... *H05K 3/1233* (2013.01); *H05K 3/3485* (2020.08); *B41P 2215/50* (2013.01); *B41P 2235/21* (2013.01); *H05K 2203/0139* (2013.01); *H05K 2203/0783* (2013.01); *H05K 2203/163* (2013.01)

(58) Field of Classification Search
CPC ............... H05K 3/3485; H05K 3/1233; H05K 2203/0139; H05K 2203/0783; H05K 2203/163
See application file for complete search history.

(56) References Cited

FOREIGN PATENT DOCUMENTS

| | | | | | |
|---|---|---|---|---|---|
| JP | 2010-125716 | A | | 6/2010 | |
| JP | 2012-162042 | A | | 8/2012 | |
| JP | 2019206095 | A | * | 12/2019 | |
| WO | WO-2020188946 | A1 | * | 9/2020 | ........... H05K 3/1233 |

* cited by examiner

PRINTING PROCESS ASSISTANCE SYSTEM

CROSS-REFERENCE TO RELATED APPLICATION

This application claims benefit of priority to International Patent Application No. PCT/JP 2022/037307, filed Oct. 5, 2022, the entire contents of which are incorporated herein by reference.

BACKGROUND

Technical Field

The present disclosure relates to a printing process assistance system that assists in improvement in qualities of a printing process of printing solder or other paste material onto a board, such as a printed wiring board.

Background Art

A screen printing device has been known as a printing device that prints cream solder or other paste material onto a board, such as a printed wiring board. The screen printing device includes a mask to overlie the board and a squeegee (spatula) that slides along an upper surface of the mask to move the paste material supplied on an upper surface of the mask. The screen printing device accordingly prints the paste material onto the board via pattern holes or openings in the mask.

The screen printing device (hereinafter, abbreviated as a "printing device") faces a "smudge" matter which is one of disadvantages that affect printing qualities. The "smudge" represents a phenomenon that the paste material enters a gap between the mask and the board through a pattern hole and the paste material is printed to excessively run to a periphery of a land. Such a "smudge" is more likely to occur as the number of printing processes (the number of boards) increases, and may cause a bridge phenomenon that the paste material may extend over adjacent lands and the lands may be electrically short-circuited depending on a level of the smudge.

To avoid such smudge occurrence, printing devices each including a cleaning mechanism that periodically cleans a lower surface of a mask have been developed. For instance, Japanese Unexamined Patent Publication No. 2012-162042 discloses a printing device that enables selective execution between dry cleaning that is a way of cleaning without a solvent and wet cleaning that is another way of cleaning with the solvent. The printing device normally executes the dry cleaning for a cleaning process, and changes the way to the wet cleaning when no improvement is seen in qualities.

The printing device is considered to enable further reliable cleaning of the mask, that is, enhance the accuracy of one cleaning process. However, on continual smudge occurrence, only enhancing the accuracy of the one cleaning process may face a difficulty in reducing or avoiding the smudge. In this respect, the printing device remains in need of improvement.

SUMMARY

The present disclosure has been accomplished in consideration of the circumstances described above, and provides a printing process assistance system that is contributable to improvement in printing qualities by reliably reducing smudge occurrence in a screen printing process.

A printing process assistance system according to one aspect of the present disclosure includes a printing part that executes a printing process of printing a paste material onto a board, which is supported by a plurality of backup pins, via openings in a mask by moving the paste material on the mask by a squeegee in a state where the mask overlies the board, and a cleaning process of cleaning a lower surface of the mask a predetermined number of times at a predetermined cleaning interval; a control part that controls an operation in each of the printing process and the cleaning process; an inspection part that inspects a level of a smudge of the paste material on the board subjected to the printing process; and an information output part that outputs, when a result of the inspection shows continual smudge occurrence, assistive information to reduce the smudge to a destination which is at least one of the control part or a notification part configured to notify an operator of information. The information output part outputs, to the destination, information to increase a frequency of cleaning processes as the assistive information.

DETAILED DESCRIPTION

Hereinafter, a preferable embodiment of the present disclosure will be described with reference to the accompanying drawings.

Configuration of a Board Production System

Figure 1:
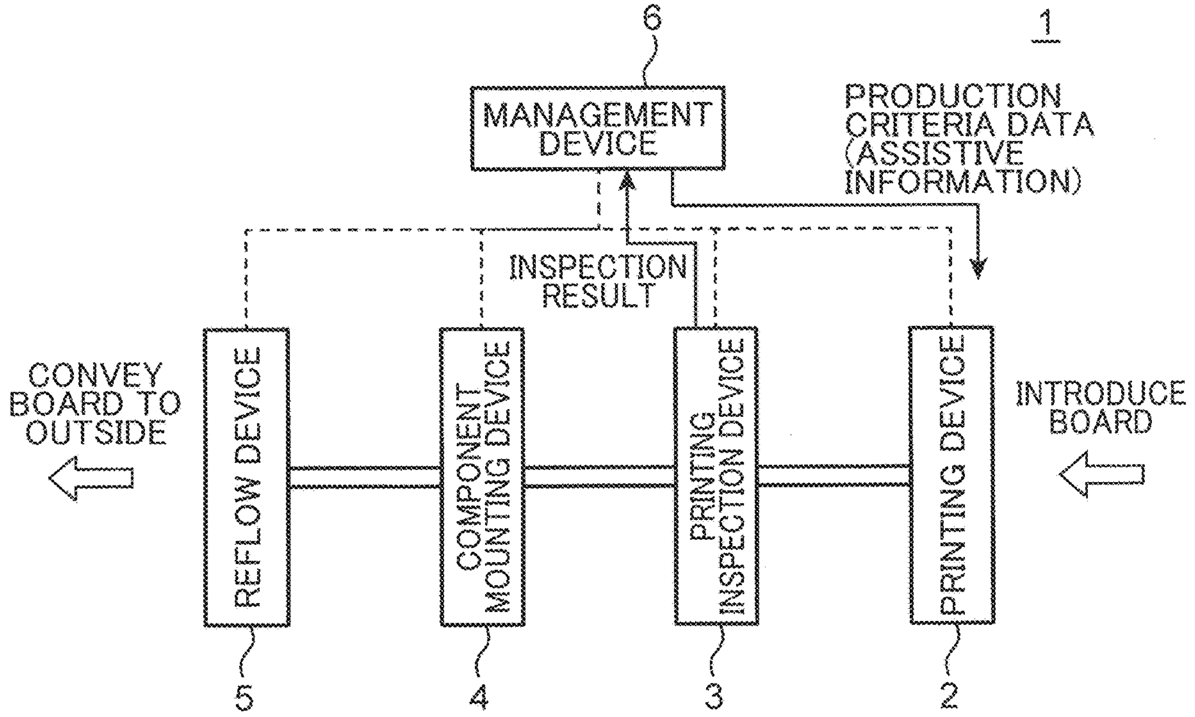
FIG. 1 is a block diagram showing an example board production system.

FIG. 1 is a block diagram showing an example board production system including a printing process assistance system according to the present disclosure. A board production system 1 produces a component mounting board by mounting a component on a board, such as a printed wiring board. The board production system 1 includes a printing device 2, a printing inspection device 3, a component mounting device 4, a reflow device 5, and a management device 6 that totally manages these devices.

The printing device 2 executes a printing process of printing cream solder serving as an example paste material (hereinafter, simply referred to as "solder") onto a land of the board. The printing inspection device 3 performs an inspection process of inspecting a solder printed state of the board subjected to the printing process. The component mounting device 4 performs a mounting process of mounting a component onto the board subjected to the printing process. The reflow device 5 performs a reflow process of melting the solder by heating the board bearing the component thereon, and solidifying the solder.

The printing device 2, the printing inspection device 3, the component mounting device 4, and the reflow device 5 are connected to each other in a row in this order in a conveyance direction of the board to form a production line. The board is subjected to the aforementioned processes respectively in the devices 2 to 5 while being conveyed in this order. The printing device 2, the printing inspection device 3, the component mounting device 4, and the reflow device 5 are communicably connected to the management device 6 through data communication.

Figure 2:
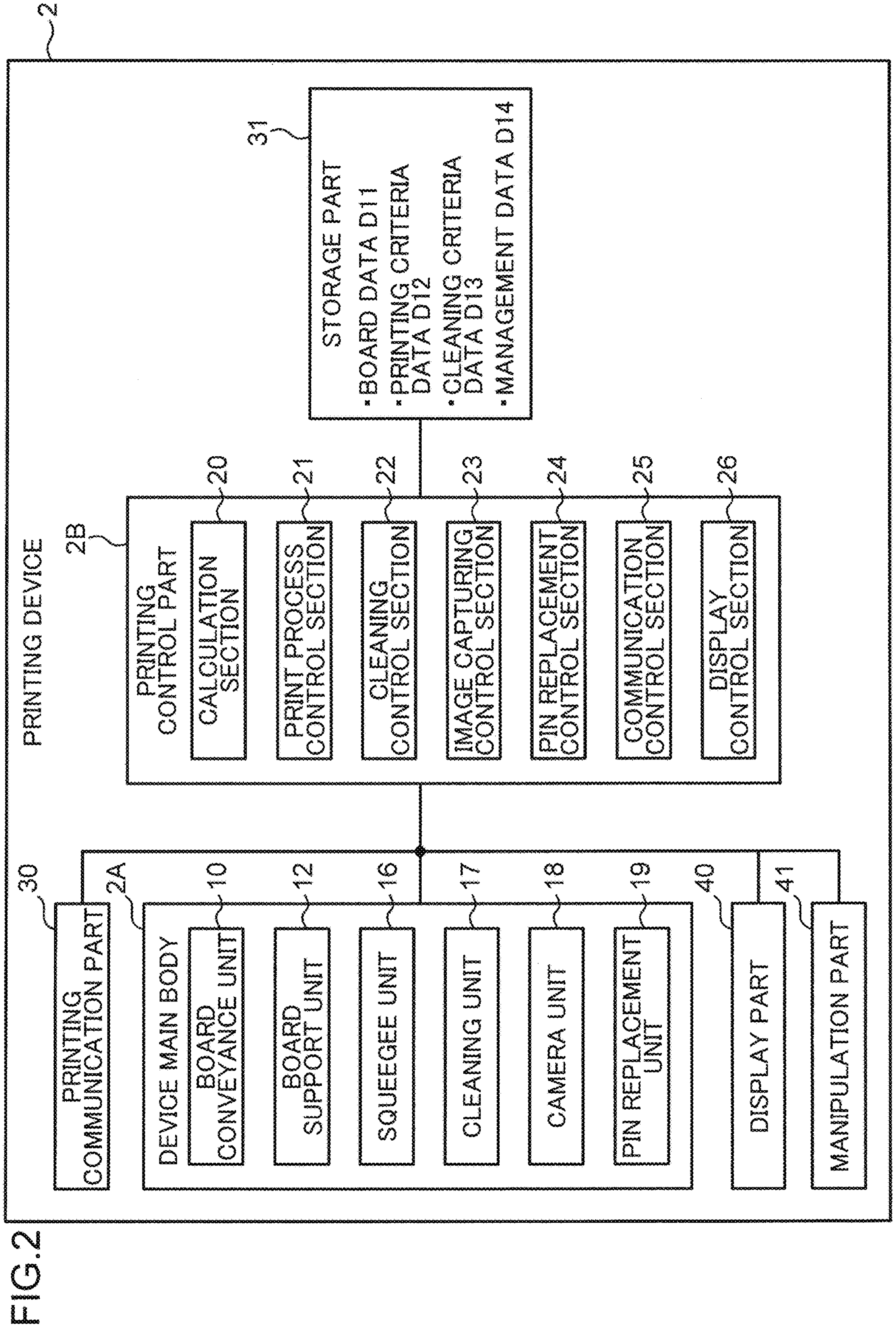
FIG. 2 is a block diagram showing an example printing device in the board production system.

FIG. 2 is a block diagram showing an example of the printing device 2. The printing device 2 includes a device main body 2A, a printing control part 2B, a printing communication part 30, a storage part 31, a display part 40, and a manipulation part 41.

The device main body 2A executes a printing process of printing solder onto a board P. The printing communication part 30 includes an interface for data communication with the management device 6 and serves to send and receive various kinds of data and information to and from the management device 6. The printing control part 2B controls an operation in the printing process or other process in the device main body 2A and controls data communication by the printing communication part 30.

Figure 3:
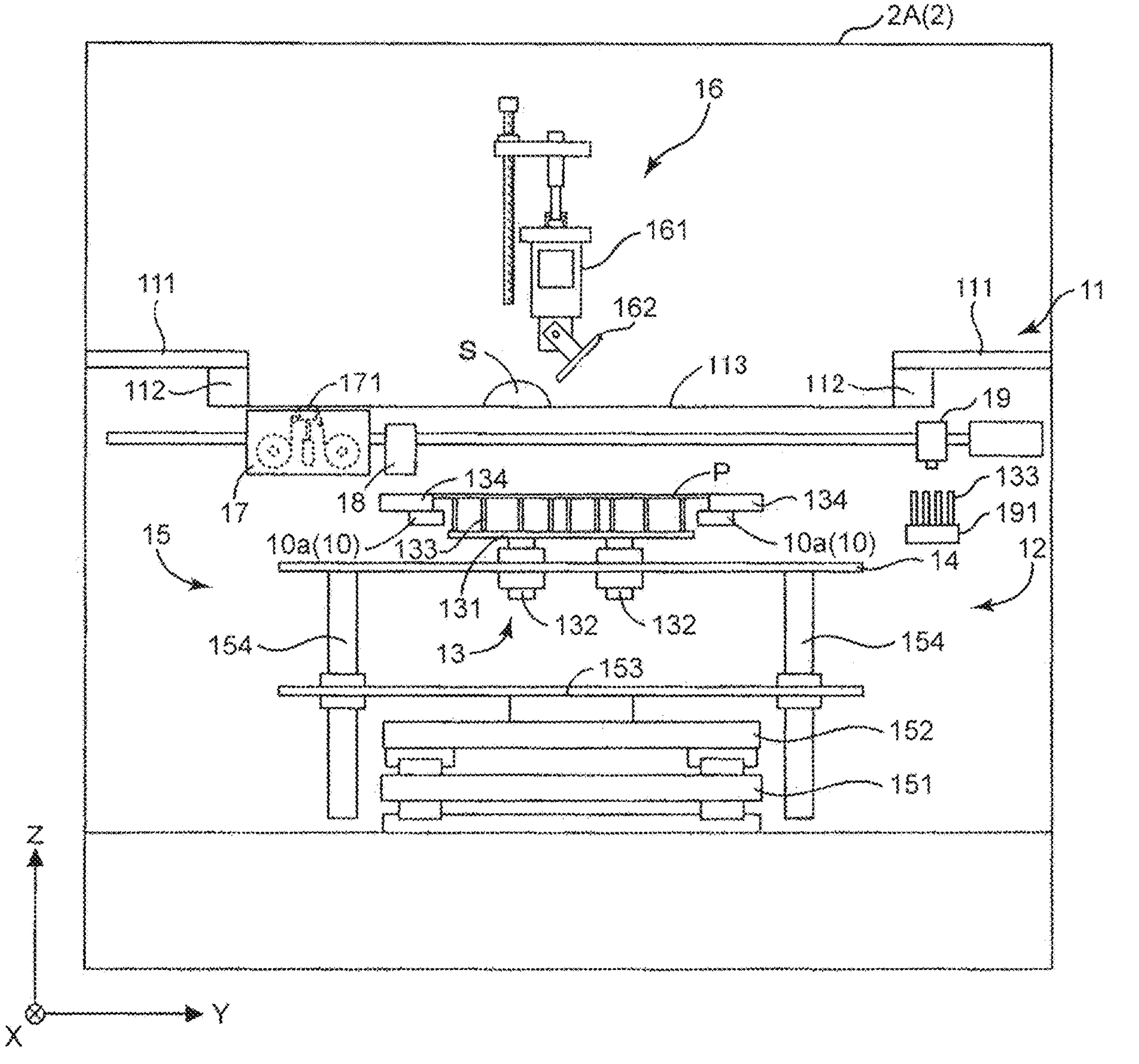
FIG. 3 is a schematic side view of a device main body of the printing device.

FIG. 3 is a schematic side view of the device main body 2A. FIG. 3 shows XYZ-rectangular coordinates defining horizontal directions as an X-direction and a Y-direction, and defining a vertical direction as a Z-direction for clarification of a directional relation thereamong. The X-direction represents a conveyance direction of the board P.

The device main body 2A serves as a screen printing device. The screen printing device is a printing device configured to print solder onto the board P by using a mask or a screen plate corresponding to a land of the board P and having pattern holes or openings. The device main body 2A includes a board conveyance unit 10, a mask holding unit 11, a board support unit 12, a squeegee unit 16, a cleaning unit 17, a camera unit 18, and a pin replacement unit 19.

The board conveyance unit 10 serves to convey the board P in the device main body 2A. The board conveyance unit 10 includes a pair of conveyor belts to convey the board P by supporting the opposite ends of the board in the example. The board conveyance unit 10 further includes three conveyors of an introduction conveyor, a work conveyor 10*a*, and a release conveyor (FIG. 3 only illustrates the work conveyor 10*a*). The introduction conveyor introduces the board P to be subjected to a printing process into the printing device. The work conveyor 10*a* receives the board P from the introduction conveyor and arranges the board at a predetermined printing work position, and transfers the board P subjected to the printing process to the release conveyor. The release conveyor conveys the board P subjected to the printing process to the outside of the printing device, that is, to the printing inspection device 3.

The mask holding unit 11 is located above the board conveyance unit 10. The mask holding unit 11 includes a mask 113 and a clamp member 111 that holds the mask. A frame 112 on a peripheral end of the mask 113 is clamped by the clamp member 111 to allow the mask to expand in parallel to an X-Y plane.

The board support unit 12 is located below the mask holding unit 11 to determine a position of the board P relative to the mask 113. The board support unit 12 includes a board support part 13, a movable table 14, and a table driving mechanism 15.

The board support part 13 is assembled to the movable table 14 together with the work conveyor 10*a*. The board support part 13 includes a raisable and lowerable table 131 on which a plurality of backup pins 133 stands, and a slide support 132 that supports the raisable and lowerable table 131 so as to be movable upward and downward relative to the movable table 14.

The raisable and lowerable table 131 is movable upward and downward relative to the movable table 14 with a drive force of a motor. The upward or downward movement of the raisable and lowerable table 131 enables transfer of the board P between the work conveyor 10*a* and the backup pins 133. For instance, when the raisable and lowerable table 131 moves upward from a home position, the board P is raised from the work conveyor 10*a* by the backup pins 133. In this manner, the board P is transferred from the work conveyor 10*a* to the backup pins 133.

The board support part 13 includes a pair of clamp plates 134. The pair of clamp plates 134 are spaced from each other in the Y-direction above the work conveyor 10*a*, and each clamp plate is shiftable between a close position and a far position with a drive force of an air cylinder. When the clamp plate 134 shifts toward the close position, the board P raised from the work conveyor 10*a* by the backup pins 133 is horizontally clamped from the opposite ends thereof in the Y-direction. At the clamping, an upper surface of the board P and an upper surface of each clamp plate 134 are flush with each other.

The table driving mechanism 15 includes a Y-axis table 151 on a base of the device main body 2A, an X-axis table 152 on an upper surface of the Y-axis table 151, an R-axis table 153 on an upper surface of the X-axis table 152, and a slide support 154 that supports the movable table 14 so as to be movable upward and downward relative to the R-axis table 153. Each of the Y-axis table 151, the X-axis table 152, the R-axis table 153, and the movable table 14 is movable in a predetermined direction with a drive force of a motor. Specifically, the Y-axis table 151 is movable in the Y-direction relative to the base of the device main body 2A, and the X-axis table 152 is movable in the X-direction relative to the Y-axis table 151. Besides, the R-axis table 153 is movable in an R-direction that is a rotation direction about an axis parallel to the Z-direction relative to the X-axis table 152, and the movable table 14 is movable upward and downward relative to the R-axis table 153.

In other words, the table driving mechanism 15 moves the work conveyor 10*a* and the board support part 13 assembled to the movable table 14 in each of the X-direction, the Y-direction, and the R-direction to bring the board P supported by the board support part 13, i.e., the board P clamped by the clamp plates 134, into contact with a lower surface of the mask 113. This consequently allows the board P to be overlaid with the mask 113.

The squeegee unit 16 is located above the mask holding unit 11. The squeegee unit 16 includes a squeegee head 161 and a squeegee 162 supported by the squeegee head.

The squeegee head 161 is movable horizontally in the Y-direction, and movable upward and downward relative to the mask 113 (mask holding unit 11) with a drive force of a motor. The squeegee 162 is a plate-shaped spatula extending in the X-direction and is supported by the squeegee head 161 in such a manner as to be swingable about an axis extending in the X-direction. The squeegee 162 swings relative to the squeegee head 161 with a drive force of a motor. The squeegee 162 comes into contact with an upper surface of the mask 113 at a predetermined angle or attack angle under a printing pressure or pressing pressure, and moves together with the squeegee head 161 along the mask 113 at a predetermined speed or squeegee speed. This results in printing the solder S onto the board P through pattern holes while moving the solder S along the upper surface of the mask 113.

Each of the cleaning unit 17, the camera unit 18, and the pin replacement unit 19 is located below the mask 113.

The cleaning unit 17 is movable in the Y-direction along the lower surface of the mask 113 with a drive force of a motor. The cleaning unit 17 has a cleaning head 171, and moves while pressing a gauze included in the cleaning head 171 against the lower surface of the mask 113. The cleaning unit cleans the mask 113 in this manner. The cleaning unit 17 can select execution of cleaning between wet-cleaning of cleaning the mask 113 by impregnating the gauze with a solvent and dry leaning of cleaning without impregnation of the solvent.

The camera unit 18 captures an image of a mark given to the upper surface of the board P supported by the backup pins 133 and an image of a mark given to the lower surface of the mask 113. The position of the mask 113 and the position of the board P are recognized from the images of the marks respectively. The camera unit 18 includes a camera at each of the upper position and the lower position thereof. The camera unit 18 is movable in the X-direction and the Y-direction between the board P to be overlaid with the mask 113 and the lower surface of the mask 113 with a drive force of a motor. The camera unit captures the images of the marks in this manner.

The pin replacement unit 19 is movable in the X-direction and the Y-direction below the mask 113 with a drive force of a motor in the same manner as the camera unit 18. The pin replacement unit 19 changes an arrangement of the backup pins 133 standing on the raisable and lowerable table 131 by transferring the backup pins 133 between the raisable and lowerable table 131 and a pin stocker 191. The raisable and lowerable table 131 has a top provided with a plurality of pin holes in a matrix form to allow the backup pins 133 to stand therein. A pin hole at a position suitable for supporting the board P among the pin holes receives a corresponding backup pin 133 therein.

A basic operation in a printing process in the device main body 2A (printing device 2) will be described below. First, a board P is introduced into the printing device by the board conveyance unit 10 to reach the printing work position in a state where the raisable and lowerable table 131 is at a lower end position. Next, the raisable and lowerable table 131 moves upward to transfer the board P from the board conveyance unit 10 (work conveyor 10*a*) to the board support part 13 (backup pins 133), and the board P is further clamped by the clamp plates 134.

When the board P is clamped, the camera unit 18 moves from a predetermined retraction position to a certain position between the mask 113 and the board P to capture images of the marks respectively on the mask 113 and the board P. The position of the mask 113 and the position of the board P are recognized from the images of the marks respectively.

Thereafter, the camera unit 18 is reset to the retraction position, and the board P supported by the board support part 13 is overlaid with the lower surface of the mask 113 through an operation of the table driving mechanism 15. At this time, the position of the board support part 13 is adjusted in the X-direction, the Y-direction, the R-direction on the basis of a result of the positional recognition of the mask 113 and the board P. The adjustment allows the board P to be overlaid with the mask 113 at a predetermined position without any deviation.

When the board P is overlaid with the mask 113, the squeegee unit 16 comes to a predetermined movement start position. The squeegee head 161 moves downward at the start position to press the squeegee 162 against the upper surface of the mask 113 at a predetermined angle or attack angle under a printing pressure or pressing force. In this state, the squeegee 162 moves in the Y-direction at a predetermined movement speed or squeegee speed in conjunction with the squeegee head 161. The solder S is printed onto the board P through the pattern hole in concurrence with the movement.

When the squeegee unit 16 moves to a movement finish position, the board support part 13 is reset to an original position through an operation of the table driving mechanism 15. This consequently allows the board P to leave the mask 113. Thereafter, the board P clamped by the clamp plates 134 is unclamped, and the raisable and lowerable table 131 moves downward. Consequently, the board P is transferred from the board support part 13 (backup pins 133) to the board conveyance unit 10 (work conveyor 10*a*). The board conveyance unit 10 conveys the board P to the outside of the printing device to finish the sequence of the printing process in the device main body 2A.

In a case where printing processes are executed for a preset number of boards P respectively, the cleaning unit 17 reciprocates from the home position (corresponding to the position shown in FIG. 3) set outside printing regions of the mask 113 along the lower surface of the mask 113 at a time when each board P leaves the mask 113. A cleaning process for the mask 113 is executed in this manner.

Referring back to FIG. 2, the display part 40 includes, for example, a liquid crystal display, and displays various kinds of information about a printing process and a cleaning process by the device main body 2A. A display operation of the display part 40 is controlled by a display control section 26 to be described later. The manipulation part 41 includes, for example, a keyboard, a mouse, or a touch screen provided to the display part 40. The manipulation part 41 receives an input manipulation of each instruction to the printing control part 2B from an operator.

The printing control part 2B includes a central processing unit (CPU), a read only memory (ROM) that stores a control program, and a random access memory (RAM) for use as a work area of the CPU. The printing control part 2B controls operations of the respective constituent elements of the device main body 2A and controls a data communication operation of the printing communication part 30 in response to execution of the control program stored in the ROM by the CPU.

The printing control part 2B includes, as main functional configurations, a calculation section 20, a printing process control section 21, a cleaning control section 22, an image capturing control section 23, a pin replacement control section 24, a communication control section 25, and the display control section 26. That is to say, the print control part serves as each of the control sections 20 to 26 in response to execution of the control program.

The calculation section 20 conducts various kinds of calculations and determinations relevant to the printing process and the cleaning process by the device main body 2A. The printing process control section 21 controls an operation in the sequence of the printing process in the device main body 2A. The cleaning control section 22 controls an operation in the cleaning process by the cleaning unit 17. The image capturing control section 23 controls an operation by the camera unit 18 to capture an image of each mark. The pin replacement control section 24 controls an operation for replacement of each backup pin 133 by the pin replacement unit 19. The communication control section 25 controls the printing communication part 30 to control data communication between the printing device 2 and the management device 6. The display control section 26 controls display by the display part 40 to display the various kinds of information and images about the printing process and the cleaning process by the device main body 2A.

The storage part 31 stores various kinds of information to be referred to at controlling each part in the device main body 2A. The various kinds of information include board data D11, printing criteria data D12, cleaning criteria data 13, and management data D14.

The board data D11 includes information about a board P or component mounting board to be produced, and includes information about a type (ID) of the board P to be produced, a printing position (coordinates of a pad and a land) on the board P of the type, and a type (ID) of a mask 113 to be used in a printing process. Besides, the board data D11 includes data about a kind of a component to be mounted by the component mounting device 4 and a mounting coordinate.

The printing criteria data D12 includes information about criteria or reference values of the printing process including: an attack angle, a printing pressure, a movement speed or squeegee speed of the squeegee 162; and an arrangement of the backup pins 133, in the printing process. Such information including the attack angle, the printing pressure, and the movement speed is stored in association with a type (ID) of solder, and information about the arrangement of the backup pins 133 is stored in association with the type (ID) of the board P.

The cleaning criteria data D13 includes information or reference values about criteria of the cleaning process including: a criterion about a countermeasure content (for each of the dry-cleaning and wet-cleaning) of the cleaning process; a criterion about a cleaning frequency; and other criterion. The cleaning frequency includes a "cleaning interval" and "the number of cleaning times".

The cleaning interval is defined by the number of cleaning processes or the number of boards P to be processed. For instance, in this example, a reference value or default value is set to "10". In other words, one cleaning process is executed after ten printing processes as one cycle. The number of cleaning times is defined by the number of reciprocations of the cleaning head 171 in one cleaning process (one cycle). For instance, in the example, a reference value or default value is set to "1". In other words, the reference value is set to one reciprocation of the cleaning head 171 from the home position (corresponding to the position shown in FIG. 3) along the lower surface of the mask 113.

The management data D14 includes a history of a printing process per board, and includes a result of the printing process, and a type of solder, a type of a mask, and production criteria (including printing criteria and cleaning criteria) each adopted in the printing processes. The management data D14 is accumulatively stored in the storage part 31 and sent to the management device 6 one piece after another piece via the printing communication part 30. As described later, the production criteria (including the printing criteria and the cleaning criteria) are occasionally changed on the basis of an inspection result by the printing inspection device 3. On such an occasion, the changed production criteria are stored as the management data D14.

Figure 4:
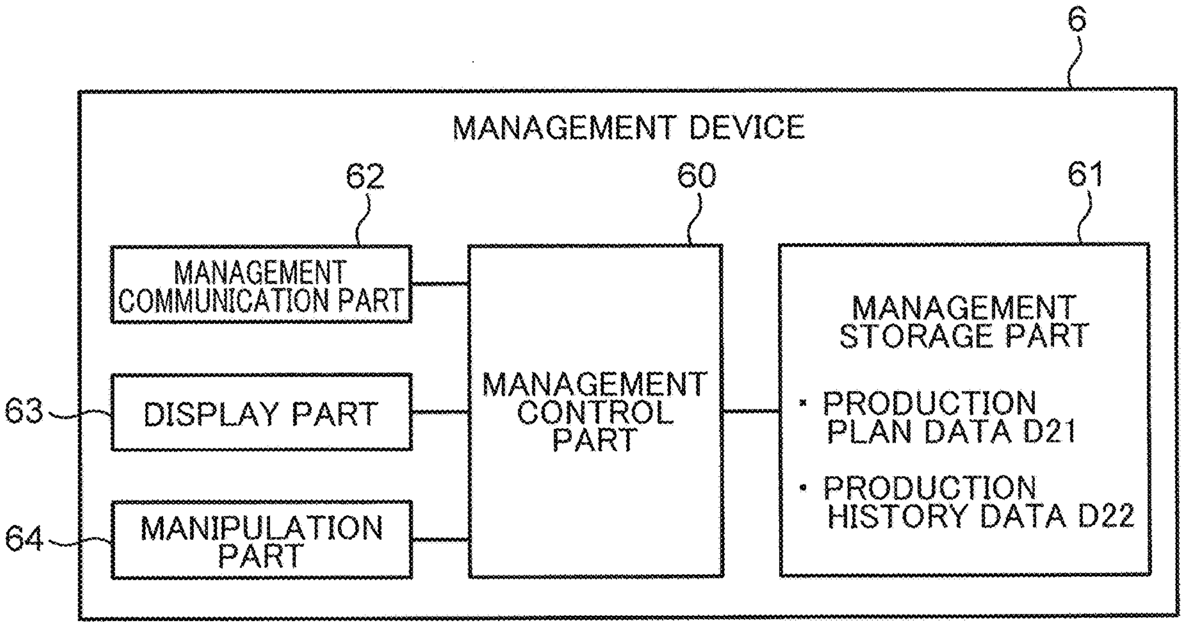
FIG. 4 is a block diagram showing an example management device in the board production system.

Next, the configuration of the management device 6 will be described. The management device 6 includes, for example, a personal computer that is communicably connected to the printing device 2, the printing inspection device 3, the component mounting device 4, and the reflow device 5 through data communication. FIG. 4 is a block diagram showing the configuration of the management device 6. The management device 6 includes a management control part 60, a management storage part 61, a management communication part 62, a display part 63, and a manipulation part 64.

The management communication part 62 includes an interface for data communication with the devices 2 to 5. The management communication part 62 acquires management data input from each of the printing inspection device 3, the component mounting device 4, and the reflow device 5 in addition to the management data D14 input from the printing device 2. For instance, the management storage part 61 acquires, as the management data, an inspection result of each board P by the printing inspection device 3, a result of a mounting process of mounting a component onto each board P by the component mounting device 4, and a result of a reflow process onto each board P by the reflow device 5.

The management storage part 61 stores production plan data D21 and production history data D22. The production plan data D21 includes data about the number of boards P to be produced and a production sequence therefor. The production history data D22 includes production history data per board, and includes management data input from each of the devices 2 to 5.

The management control part 60 includes a CPU, a ROM, and a RAM. The management control part 60 executes various kinds of processing to manage the operations of the devices 2 to 5 of the board production system 1 by causing the CPU to execute the control program stored in the ROM, and controls the management communication part 62 to control data communication between each of the devices 2 to 5 and the management device 6.

The management control part 60 executes, in this example, printing assistance as one of the various kinds of processing to manage the operation. The printing assistance includes assisting in improvement in printing qualities in the printing device 2. Specifically, the printing assistance includes assisting in reducing a smudge on a board P. The "smudge" represents a phenomenon that solder enters a gap between the mask 113 and the board P through a pattern hole and the solder is printed to excessively run to a periphery of a land. The printing assistance will be described in detail later.

The display part 63 displays information about the data D21, D22 stored in the management storage part 61. The management control part 60 controls a display operation of the display part 63. The manipulation part 64 includes, for example, a keyboard, a mouse, or a touch screen provided to the display part 63.

First embodiment concerning the printing assistance

Figure 5:
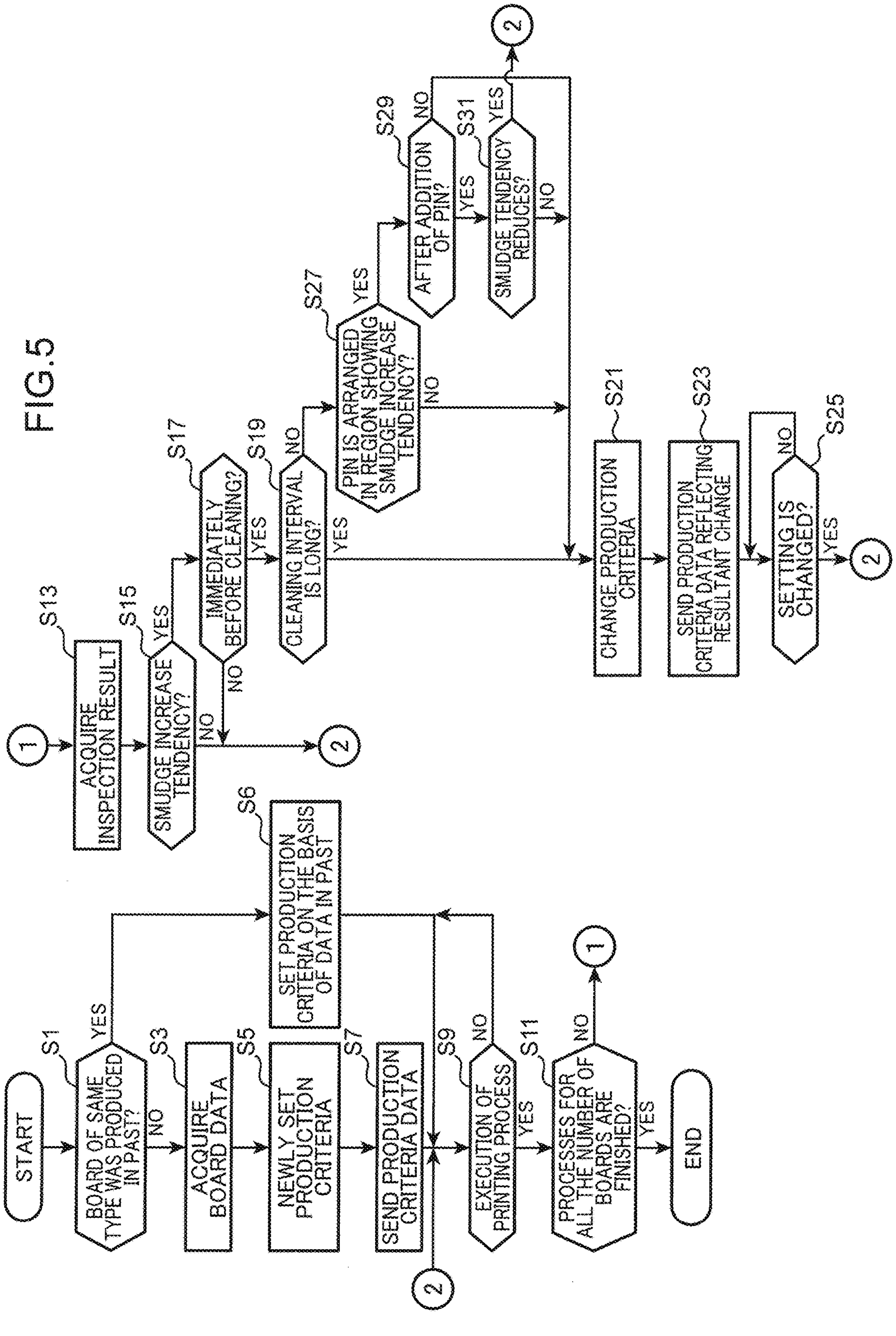
FIG. 5 is a flowchart showing a first embodiment concerning printing assistance.

FIG. 5 is a flowchart showing a control in the printing assistance (first embodiment) by the management control part 60. The printing assistance is started before a start of a printing process for a board P by the printing device 2. Once the flowchart is started, the management control part 60 determines whether a production target board P is of the same type as a type of a board produced in past with reference to the production plan data D21 and the production history data D22 in the management storage part 61 (step S1).

When the determination is made as "No" here, the management control part 60 acquires printing criteria data D12 and cleaning criteria data D13 from the printing device 2 via the management communication part 62, and newly sets production criteria for the board P on the basis of the data D12 and D13 (steps S3 and S5). In this case, the management control part 60 sets reference values of printing criteria (about an attack angle, a printing pressure, and a pin arrangement) as defined in the printing criteria data D12 and reference values of the cleaning criteria (about a countermeasure content, a cleaning interval, and the number of cleaning times) as defined in the cleaning criteria data D13 to initial values of the production criteria.

It is noted here that the management control part 60 may further acquire the board data D11 from the printing device 2 and set the initial values of the production criteria by executing a predetermined simulation process based on a pattern layout of the production target board.

In contrast, when the determination is made as "Yes" in step S1, that is, when it is determined that the production target board P is of the same type as the type of the board produced in past, the management control part 60 sets production criteria on the basis of the production history data D22. Specifically, for example, production criteria registered in the latest management data D14 among the past management data D14 for boards P are set to initial values.

The management control part 60 may set the initial values of the production criteria by executing the predetermined simulation process based on the past management data D14 in this case as well.

After the setting of the production criteria, the management control part 60 sends relevant production criteria data to the printing device 2 via the management communication part 62 (step S7). The printing device 2 or printing control part 2B acquires the production criteria data via the printing communication part 30 and starts the printing process for the board P on the basis of the production criteria data.

The management control part 60 waits for execution of the printing process (Yes in step S9), and determines whether printing processes for a scheduled number of (all the) boards P are finished (step S11) once the printing process has been executed. When the determination is made as "No", the management control part 60 acquires a printing result about each board P from the printing inspection device 3 via the management communication part 62 (step S13).

The printing inspection device 3 includes a camera unit, and causes the camera unit to capture an image of each board P subjected to the associated printing process in a plan view, and inspects a printed state of the solder on the basis of relevant image data, and sends a result of the inspection to the management device 6 as management data. Inspection items include "smudge level inspection". A level of a smudge is evaluable with a proportion R (%) of an actual printing area to a reference printing area=a land area for the solder. The smudge level inspection shows determination on a printing failure when the area proportion R exceeds a preset upper limit value Rn. The management data sent to the management device 6 includes the image data and the data about the area proportion R.

When the inspection result is acquired in step S13, the management control part 60 determines whether the acquired inspection result shows a smudge increase tendency or a tendency that the smudge increases, which is an example of continual smudge occurrence (step S15). For instance, the management control part 60 compares an area proportion R in an inspection result acquired at present with an area proportion R in a previously acquired inspection result, that is, an inspection result for a preceding board, and makes the determination in step S15 on the basis of a difference between the area proportions. In this case, the management control part 60 may make the determination in step S15 on the basis of in section results including the inspection result acquired at present and a plurality of previous continuous inspection results or area proportions R.

When it is determined that a smudge increase tendency is not seen in step S15 (No in step S15), the management control part 60 leads the process to step S9. In contrast, when it is determined that a smudge increase tendency is seen (Yes in step S15), the management control part 60 determines whether the inspection result acquired in step S13 indicates an inspection result immediately before or substantially immediately before a cleaning process (hereinafter, referred to as an "inspection result immediately before cleaning process" for convenience) (step S17). In this example, the management control part 60 determines whether the acquired inspection result indicates an inspection result of a secondly previous printing process from the cleaning process. Specifically, when a specific cleaning criterion is set to the associated reference value, that is, when the cleaning process is defined to be executed after one cycle of ten printing processes, it is determined whether the acquired inspection result indicates the ninth inspection result (of the ninth board).

When the acquired inspection result does not indicate the inspection result immediately before cleaning process (No in step S17), the management control part 60 leads the process to step S9. In contrast, when the inspection result indicates the inspection result immediately before cleaning process (Yes in step S17), the management control part 60 determines whether a cleaning interval under an associated cleaning criterion among the cleaning criteria is longer, that is, determines whether the cleaning interval is appropriate or inappropriate (step S19). Specifically, it is determined whether a value of the area proportion R in the inspection result acquired in step S13 falls within a range from an alert value Rw to the upper limit value Rn. The range from the alert value Rw to the upper limit value Rn shows a limit level of an acceptable smudge.

When it is determined that the cleaning interval is long or inappropriate (Yes in step S19), the management control part 60 leads the process to step S21 to change the production criteria set in steps S5 and S6 as described later.

In contrast, when it is determined that the cleaning interval is not long or is appropriate (No in step S19), the management control part 60 specifies a region showing a smudge increase tendency (hereinafter, simply referred to as a "smudge increase region") among the printing regions on the board P on the basis of image data in the inspection result, and determines whether a backup pin 133 is arranged in the smudge increase region (step S27). In other words, appropriateness or inappropriateness of a pin arrangement is determined under an associated printing criterion among printing criteria.

Figure 6:
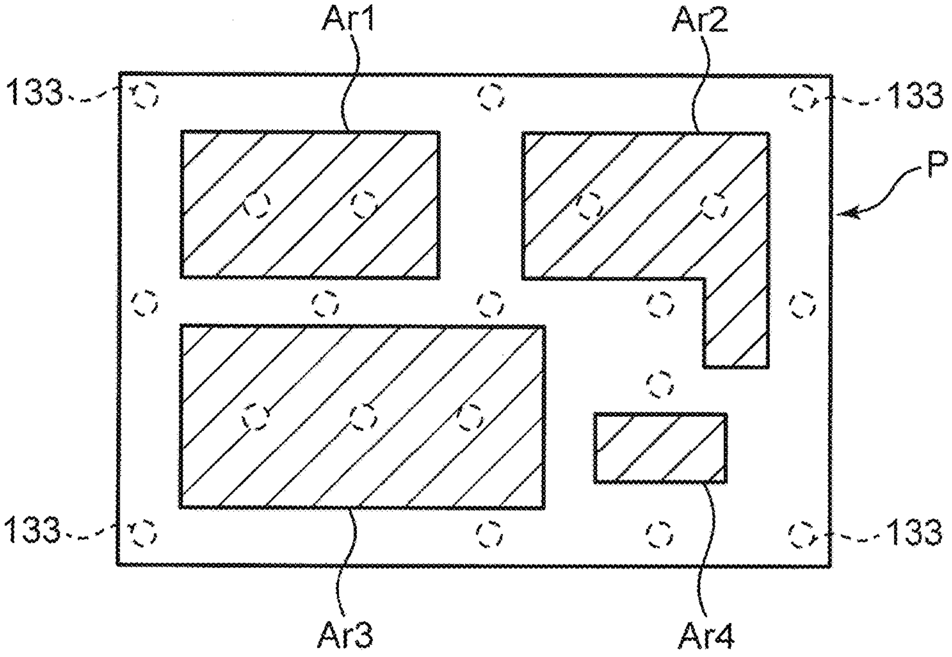
FIG. 6 is a schematic view showing a positional relation between printing regions on the board and backup pins.

For instance, as illustrated in FIG. 6, a board P is supposed to have been subjected to a printing process in a plurality of regions Ar1 to Ar4 thereon. The management control part 60 specifies a smudge increase region on the basis of an area proportion R of each of the regions Ar1 to Ar4, and further determines whether a backup pin 133 is arranged in the specified smudge increase region on the basis of the pin arrangement under the printing criterion.

When it is determined that no backup pin 133 is arranged in the smudge increase region (No in step S27), the management control part 60 leads the process to step S21 to change the production criteria as described later.

When the determination is made as "Yes" in step S27, that is, when it is determined that a backup pin 133 is arranged in the smudge increase region, the management control part 60 determines whether the inspection result acquired in step S13 indicates an inspection result showing changed arrangement of the backup pins 133 or reflecting resultant addition of a backup pin 133 (step S29). When the determination is made as "No" here, the management control part 60 leads the process to step S2 to change the production criteria as described later. In brief, in a case where a backup pin 133 is originally or initially arranged in the smudge increase region specified in step S27, the management control part 60 determines "No" in step S29.

In contrast, when it is determined that the inspection result acquired in step S13 indicates the inspection result showing changed arrangement of the backup pins 133 (Yes in step S29), the management control part 60 determines whether the smudge tendency in the smudge increase region reduces (step S31). For instance, the management control part 60 compares an inspection result at present with a previous inspection result, that is, an inspection result for a preceding board P, concerning the smudge increase region, and determines that the smudge tendency reduces when the area proportion R is equivalent or reduces.

When it is determined that the smudge tendency reduces in step S31 (Yes in step S31), the management control part 60 leads the process to step S9. In contrast, when it is determined that the smudge tendency does not reduce (No in step S31), the management control part 60 leads the process to step S21 and changes the production criteria as described later.

In step S21, the management control part 60 changes and updates the production criteria set in step S5 or S6. In this case, a certain criterion to be changed differs depending on a result of each step among steps S19, S27, S29, and S31 as described below.

First, when the determination is made as "Yes" in step S19, that is, when it is determined that the cleaning interval is long or inappropriate, the management control part 60 shortens the cleaning interval under the associated cleaning criterion. For instance, the management control part 60 shortens the cleaning interval by a preset number of printing processes. In this case, the number of printing processes to be decreased may be determined depending on a specific smudge increase tendency (an increase rate of the area proportion R). Such a smudge increase is often attributed to a lack of cleaning of the mask 113. From this perspective, the cleaning interval is shortened when the area proportion R falls within the range from the alert value Rw to the upper limit value Rn immediately before a cleaning process.

Next, when the determination is made as "No" in step S27, that is, when no backup pin 133 is arranged in the smudge increase region, the management control part 60 changes a pin arrangement under the associated printing criterion to add a backup pin 133 in the smudge increase region and/or around the region.

When the cleaning interval is appropriate or is not long, the smudge increase may be attributed to deflection of the board P caused by a lack of supportive force of each backup pin 133 or other reason. Hence, when a smudge increase tendency is seen and the cleaning interval is determined as appropriate, a backup pin 133 is added in the smudge increase region and/or around the region. For instance, when the region Ar4 in FIG. 6 is supposed to be a smudge increase region, a backup pin 133 is added to the region Ar4 and/or around the region.

Then, when the determination is made as "No" in step S29, that is, when it is determined that the inspection result does not indicate an inspection result showing changed arrangement of the backup pins 133, the management control part 60 changes another printing criterion or criteria about the attack angle and/or the printing pressure among the printing criteria except the printing criterion about the pin arrangement. In brief, when a backup pin 133 is originally or initially arranged in the smudge increase region specified in step S27, the management control part 60 changes the attack angle and/or the printing pressure of the squeegee 162 to reduce the smudge. For instance, the management control part 60 increases the attack angle and/or decreases the printing pressure only by a preset adjustment degree or amount. In this case, a specific degree or amount of the attack angle and/or the printing pressure may be determined depending on a specific smudge increase tendency or an increase rate of the area proportion R.

Subsequently, when the determination is made as "No" in step S31, that is, when it is determined that the smudge tendency does not reduce, the management control part 60 changes another printing criterion or criteria about the attack angle and/or the printing pressure among the printing criteria except the printing criterion about the pin arrangement. Specifically, such a change is equivalent to a change in the printing criterion or criteria about the attack angle and/or the printing pressure in the determination as "No" in step S29.

The determination "No" in each of steps S29 and S31 briefly means that the cleaning interval is determinable as appropriate and that the pin arrangement is determinable as appropriate. A smudge increase in this case may be attributed to another printing criterion except the printing criterion about the pin arrangement. Accordingly, when the determination is made as "No" in each of steps S29 and S31, the management control part 60 changes another printing criterion or criteria about the attack angle and/or the printing pressure except the printing criterion about the pin arrangement.

When production criteria are changed in step S21, the management control part 60 sends management communication part 62.

The production criteria data reflecting the resultant change to be sent from the management control part 60 to the printing device 2 corresponds to the "assistive information" in the present disclosure. Specifically, production criteria data reflecting a change in (shortening of) a cleaning interval corresponds to the "first assistive information" in the present disclosure, and production criteria data reflecting a resultant change in the arrangement of the backup pins 133 corresponds to the "second assistive information" in the present disclosure. Besides, production criteria data reflecting a change in a certain printing criterion except the criterion about the pin arrangement and the determination made as "No" in step S29 corresponds to the "second assistive information" in the present disclosure as well. Further, production criteria data reflecting a resultant change in a certain printing criterion except the printing criterion about the pin arrangement from the determination made as "No" in step S31 corresponds to the "third printing information" in the present disclosure.

The printing control part 2B updates the production criteria on the basis of the production criteria data acquired via the printing communication part 30. In this case, when the acquired production criteria data involves a change in the pin arrangement, the printing control part 2B controls the pin replacement unit 19 to add a backup pin 133 to the raisable and lowerable table 131.

Next, the management control part 60 determines, on the basis of presence or absence of an input of a completion signal from the printing device 2, whether a change in the production criteria is completed in the printing device 2 (step S25). When the determination is made as "Yes" here, the management control part 60 leads the process to step S9. Then, when the determination is finally made as "Yes" in step S11, that is, when it is determined that the printing processes for the scheduled number of (all the) boards P are finished, the management control part 60 finishes the printing assistance.

Here, a relation between the printing assistance and an operation to change the cleaning interval in the printing device 2 will be described with reference to FIG. 7.

Figure 7:
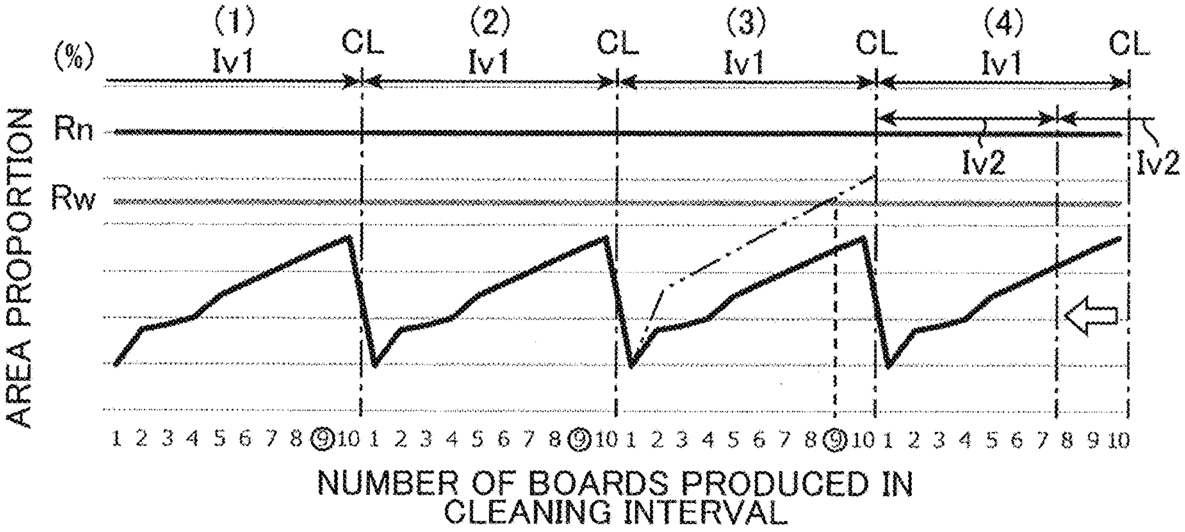
FIG. 7 is a graph showing a relation between a smudge tendency and a cleaning process.

FIG. 7 is a graph showing a relation between a smudge tendency and a cleaning process. A vertical axis denotes an inspection result or area proportion R of the printing inspection device 3, and a horizontal axis denotes the number of printing processes or the number of boards. In the graph, when a specific cleaning criterion is set to the associated reference value, that is, when one cycle is defined to include ten printing processes and the one cycle is at a cleaning interval Iv1 (the sign "CL" denotes a cleaning process), a change in the area proportion R (smudge tendency) is denoted by a solid line. The reference numerals "(1)" to "(4)" in the graph show distinction of the cycles of the printing process.

As shown in FIG. 7, a smudge tends to be the least immediately after a cleaning process, and has a tendency to gradually increase as the number of printing processes increases. When such a smudge increase tendency is seen it is determined in the printing assistance whether the cleaning interval Iv1 is appropriate or inappropriate on the basis of the smudge tendency immediately before each cleaning process. Specifically, as described above, it is determined whether the cleaning interval Iv1 is appropriate or inappropriate on the basis of the inspection result of the ninth printing process for the ninth board (in each of steps S17 and S19).

For instance, when the area proportion R in the ninth printing process falls within the range from the alert value Rw to the upper limit value Rn as shown in a smudge tendency in the third cycle denoted by a dashed-double dotted line in the graph, a cleaning interval at the fourth cycle and thereafter is shortened from Iv1 to Iv2. The example in the graph shows the interval shortened from the interval Iv1 of one cycle including the ten printing processes to the interval Iv2 of one cycle including seven printing processes. Shortening the cleaning interval in this manner can lead to a reduction in the smudge increase tendency thereafter.

In the embodiment described above, the printing device 2 corresponds to the "printing part" in the present disclosure, and the printing inspection device 3 corresponds to the "inspection part" in the present disclosure. The management control part 60 or management device 6 corresponds to the "information output part" in the present disclosure, and the printing control part 2B corresponds to the "control part or destination" in the present disclosure. Accordingly, the printing device 2, the printing inspection device 3, and the management control part 60 or management device 6 correspond to the "printing process assistance system" in the present disclosure in the embodiment. Moreover, in the embodiment, the management storage part 61 corresponds to the "storage part" in the present disclosure, and the management control part 60 corresponds to the "production criterion determination part" in the present disclosure.

Operational Effects

Conclusively, in the board production system or printing process assistance system, the printing inspection device 3 inspects a level of a smudge after a printing process by the printing device 2. When a smudge increase tendency is seen (Yes in step S15) and it is determined that a cleaning interval is long (Yes in step S19) on the basis of a result of the inspection, production criteria are changed to shorten the cleaning interval, and relevant production criteria data (first assistive information) is sent to the printing device 2. In this manner, the cleaning interval is shortened. Hence, when the smudge is attributed to the inappropriateness of the cleaning interval that is long, the cleaning interval is shortened to reduce such smudge occurrence. This results in improving the printing qualities.

In contrast, when it is determined that the cleaning interval is not long or is appropriate (No in step S19), a smudge increase region on the board P is further specified, and it is determined whether a backup pin 133 is arranged in the smudge increase region. When it is determined that no backup pin 133 is arranged (no in step S27), production criteria are changed to arrange a backup pin 133 in the smudge increase region and/or around the region, and relevant production data (second assistive information) is sent to the printing device 2. In this manner, a backup pin 133 is added in the printing device 2 to thereby solve the lack of supportive force for the board P. Accordingly, the addition of the backup pin 133 leads to a reduction in such smudge occurrence when the smudge is attributed to the lack of supportive force for the board P. This results in improving the printing qualities.

When it is determined that the backup pin 133 is originally or initially arranged in the smudge increase region (No in step S29), a certain printing criterion, such as a printing criterion about an attack angle of the squeegee 162 or a printing criterion about a printing pressure thereof, is changed, and relevant production criteria data (second assistive information) is sent to the printing device 2. Similarly, when it is determined that the printing qualities are not improved regardless of addition of a backup pin 133 (No in step S31), a certain printing criterion, such as a printing criterion about an attack angle of the squeegee 162 or a printing criterion about a printing pressure thereof, is changed, and relevant production criteria data (third assistive information) is sent to the printing device 2. In this manner, the attack angle or the printing pressure of the squeegee 162 in the printing device 2 is changed. The change in the attack angle or the printing pressure leads to a reduction in smudge occurrence when the smudge is attributed to the attack angle or the printing pressure of the squeegee 162. This results in improving the printing qualities.

In a case where a production target board P is of the same type of a type of a board produced in past, the board production system or printing process assistance system sets production criteria in past for the board P stored in the production history data D22 to initial values. The printing device 2 starts a printing process on the basis of the production criteria. It is seen from this perspective that such a board P of the same type of a type of a board produced in past can avoid an occurrence of a smudge from a start of a printing process therefor.

In the printing assistance, the management control part 60 determines appropriateness or inappropriateness of a cleaning interval on the basis of an inspection result immediately before or substantially immediately before a cleaning process (in each of steps S17 and S19 in FIG. 5). Specifically, the appropriateness or inappropriateness of the cleaning interval is determined on the basis of an inspection result of the secondly previous printing process, that is, the ninth printing process in one cycle. However, the determination may be made on the basis of a smudge tendency (area proportion R) in a printing process executed at a substantially middle point or thereafter in the cleaning interval. Specifically, the determination may be made on the basis of inspection results of a plurality of printing processes including the fifth printing process and subsequent processes in the one cycle.

In the printing assistance, when appropriateness or inappropriateness of the cleaning interval is determined (step S19 in FIG. 5) for determination on appropriateness or inappropriateness of the frequency of cleaning processes and the determination is made as inappropriate, production criteria data (first assistive information) reflecting a change to shorten the cleaning interval is sent to the printing device 2 (steps S21 and S23).

In contrast, when appropriateness or inappropriateness of the number of cleaning times is determined for determination on appropriateness or inappropriateness of the cleaning times and the determination is made as inappropriate, production criteria data reflecting a change to increase the number of cleaning times may be sent to the printing device 2. Specifically, production criteria data reflecting a change in the number of cleaning times from one-time reciprocation to two or more-time reciprocation may be sent. In this case, determination on appropriateness or inappropriateness of the number of cleaning times may be adopted instead of the determination on the appropriateness or inappropriateness of the cleaning interval. Alternatively, the determination on appropriateness or inappropriateness of the number of cleaning times may be adopted in addition to the determination on the appropriateness or inappropriateness of the cleaning interval.

Second Embodiment Concerning a Control in Printing Assistance

Figure 8:
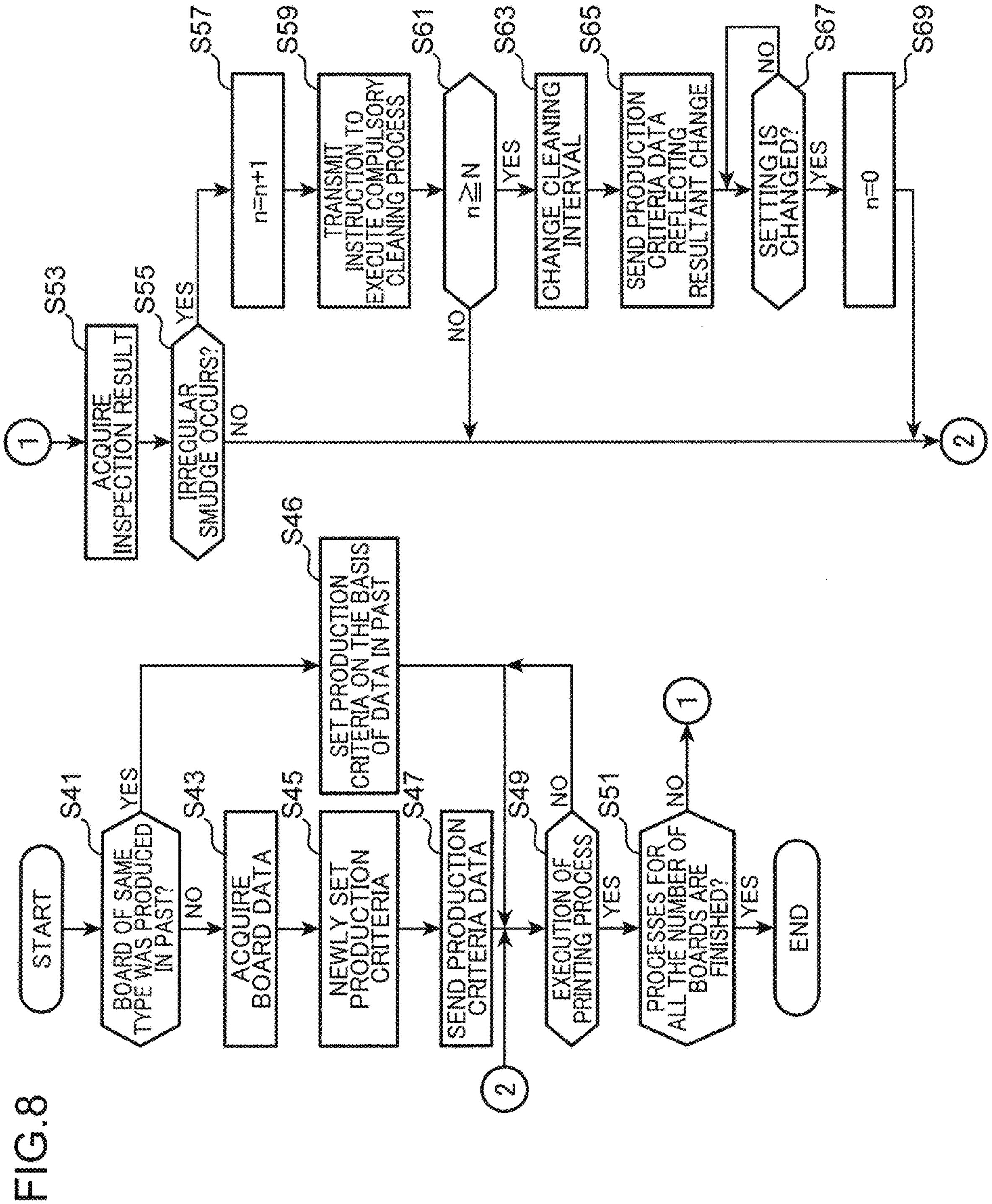
FIG. 8 is a flowchart showing a second embodiment concerning the printing assistance.

FIG. 8 is a flowchart showing the second embodiment concerning a control in the printing assistance by the management control part 60. The contents in steps S41 to S53 in the flowchart correspond to the contents in steps S1 to S13 in the first embodiment (FIG. 5), and thus, details of description for these steps will be omitted to avoid redundance. Next, step S53 and subsequent steps will be described.

When an inspection result is acquired in step S53, the management control part 60 determines, on the basis of the acquired inspection result, whether an irregular or abrupt smudge occurs (step S55). For instance, the management control part 60 determines that an irregular smudge occurs when an area proportion R in the inspection result acquired in step S53 increases from an area proportion R in a previously acquired inspection result by a predetermined value or more and exceeds an alert value Rw corresponding to the "threshold" in the present disclosure.

When the determination is made as "No" in step S55, the management control part 60 leads the process to step S49. In contrast, when the determination is made as "Yes", the management control part 60 increments a counter value n to count an occurrence of such an irregular smudge (by +1) and transmits an execution instruction to compulsorily execute a cleaning process via the management communication part 62 (step S59).

The printing control part 2B acquires the execution instruction via the printing communication part 30. The printing control part 2B having acquired the execution instruction executes a cleaning process before a start of a printing process for a subsequent board P after a finish of a present printing process in progress. When such a compulsory cleaning process is about to be simultaneous with a normal cleaning process based on cleaning criteria, the printing control part 2B executes only one of the cleaning processes. The compulsory cleaning process is executed under a certain cleaning criterion except the cleaning criterion about the cleaning interval in production criteria.

The management control part 60 determines whether the number of occurrences of irregular smudges reaches a set value N (e.g., N=2) after the transmission of the execution instruction (step S61). When the determination is made as "Yes" here, the management control part 60 shortens the cleaning interval under the associated cleaning criterion (step S63). For instance, the management control part 60 shortens the cleaning interval by a preset number of printing processes. When the determination is made as "No" in step S61, the management control part 60 leads the process to step 49.

When the cleaning interval is changed in step S63, the management control part 60 sends relevant production criteria data (corresponding to the "assistive information" in the present disclosure) reflecting a resultant change to the printing device 2 via the management communication part 62 (step S65).

Then, it is determined whether a change in setting of the cleaning criteria is completed in the printing device 2 on the basis of presence or absence of an input of a completion signal from the printing device 2 (step S67). When the determination is made as "Yes" here, the management control part 60 resets the counter value to "0" (step S69), and leads the process to step S49. When the determination is finally made as "Yes" in step S51, that is, when the printing processes for the scheduled number of (all the) boards P are finished, the management control part 60 finishes the printing assistance.

Here, a relation between the printing assistance and operations to execute the compulsory cleaning process and change the cleaning interval by the printing device 2 in the second embodiment will be described with reference to FIG. 9.

Figure 9:
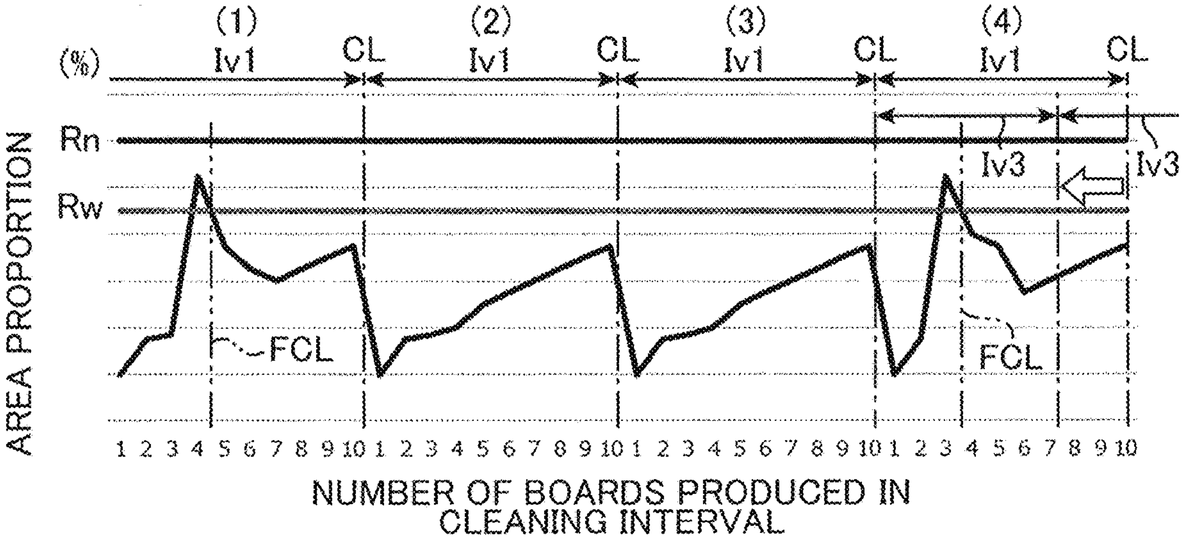
FIG. 9 is a graph showing a relation between a smudge tendency and a cleaning process.

FIG. 9 is a graph showing a relation between a smudge tendency and a cleaning process like the graph in FIG. 7. FIG. 9 shows an occurrence of an irregular smudge at each of the fourth printing process for the fourth board in the first cycle and the third printing process for the third board in the fourth cycle. When such a smudge tendency is seen, a compulsory cleaning process (denoted by the sign "FCL") is executed after each of the fourth printing process in the first cycle and the third printing process in the fourth cycle.

In the case of the set value N=2 (step S61 in FIG. 8), the cleaning interval in the fourth cycle and thereafter is shortened from the interval Iv1 to the interval Iv3. In the example in the graph, the cleaning interval is shortened from the interval Iv1 of one cycle including ten printing processes to the interval Iv3 of one cycle including seven printing processes. Shortening the cleaning interval in this manner can lead to a reduction in irregular smudge occurrence thereafter.

Besides, execution of a compulsory cleaning process immediately after an occurrence of such an irregular smudge achieves prevention of occurrences of smudges continually or consecutively exceeding the alert value Rw in subsequent printing processes after the occurrence of the irregular smudge serving as an opportunity.

Modifications

The board production system 1 described heretofore exemplifies a preferable embodiment of a board production system including the printing process assistance system of the present disclosure. The specific configuration of the board production system 1 and the specific configuration of the printing process assistance system are appropriately changeable in a range without deviation from the gist of the present disclosure.

For instance, in the embodiment, the production criteria data reflecting the resultant change and corresponding to the "assistive information" in the present disclosure is sent from the management control part 60 to the printing device 2, and the printing control part 2B changes the setting of the production criteria on the basis of relevant production criteria data. Alternatively, the printing control part 2B or display control section 26 may control the display part 40 to display the production criteria reflecting the resultant change so that an operator having confirmed the display can change the setting by manipulating the manipulation part 41. The operator may manually add a backup pin 133 to change the pin arrangement. In this configuration, the display control section 26 and the display part 40 correspond to the "notification part" in the present disclosure.

Specifically, the operator may finally make a determination on the changed production criteria, and the operator may change the relevant setting if necessary. This configuration enables a change in the setting of the production criteria in consideration of the experience of the operator. In this case, the production criteria data reflecting the resultant change may be sent from the management device 6 to a mobile terminal or notification part, such as a tablet, to be displayed thereon, and the operator may change the production criteria with reference to the display by manipulating the manipulation part 41 of the printing device 2 or manipulating the mobile terminal.

In the embodiment, the management control part 60 of the management device 6 that totally manages the board production system 1 including the printing device 2, the printing inspection device 3, the component mounting device 4, and the reflow device 5 executes the printing assistance. In other words, as described above, the management control part 60 corresponds to the "information output part" in the present disclosure. However, the information output part may be in the form of a special device independent of the management device 6 or management control part 60.

Disclosure Covered by the Embodiment

A printing process assistance system according to one aspect of the present disclosure includes a printing part that executes a printing process of printing a paste material onto a board, which is supported by a plurality of backup pins, via openings in a mask by moving the paste material on the mask by a squeegee in a state where the mask overlies the board, and a cleaning process of cleaning a lower surface of the mask a predetermined number of times at a predetermined cleaning interval; a control part that controls an operation in each of the printing process and the cleaning process; an inspection part that inspects a level of a smudge of the paste material on the board subjected to the printing process; and an information output part that outputs, when a result of the inspection shows continual smudge occurrence, assistive information to reduce the smudge to a destination which is at least one of the control part or a notification part configured to notify an operator of information. The information output part outputs, to the destination, information to increase a frequency of cleaning processes as the assistive information.

In the printing process assistance system, the inspection part inspects a smudge after a printing process by the printing part. When a result of the inspection shows continual smudge occurrence, the information output part outputs assistive information to reduce the smudge to the destination (the control part and/or the notification part). Specifically, information to increase the frequency of cleaning processes is output to the destination. The information to increase the frequency of cleaning processes includes, for example, information to shorten the cleaning interval and information to increase the number of cleaning times in one cleaning process. The frequency of cleaning processes is increased in the printing part on the basis of the information. Alternatively, the frequency of cleaning processes is increased through a manipulation from the operator to the printing part on the basis of the notification information by the notification part. The configuration further reliably reduces smudge occurrence in a subsequent printing process. This results in improving the printing qualities.

In this configuration, the information output part is configured to determine appropriateness or inappropriateness of the frequency of cleaning processes on the basis of a smudge tendency, and outputs the assistive information to the destination when determining that the frequency is inappropriate.

This configuration includes determining the appropriateness or inappropriateness of the frequency of cleaning processes on the basis of the smudge tendency, and outputting the assistive information to the destination when determining that the frequency is inappropriate. This consequently rationally increases the frequency of cleaning processes depending on a smudge tendency.

For instance, the information output part outputs the assistive information to the destination on a plurality of occurrences of smudges each having a level exceeding a preset threshold in a predetermined number of cleaning cycles.

This configuration can increase the frequency of cleaning processes after an occurrence of an irregular or abrupt smudge serving as an opportunity. The configuration is hence effective to reduce such irregular or abrupt smudge occurrence.

In this case, the information output part outputs, to the destination, information to compulsorily execute a cleaning process on an occurrence of a smudge having a level exceeding the threshold.

This configuration executes a compulsory cleaning process in the printing part on an occurrence of an irregular or abrupt smudge. The configuration hence reduces or prevents continual smudge occurrence in a subsequent printing process after the occurrence of the irregular smudge serving as an opportunity.

Further, under definition of the assistive information as first assistive information, the information output part outputs, to the destination, second assistive information to reduce the smudge and change criteria of the printing process when it is determined that the frequency of cleaning processes is appropriate.

This configuration can reduce or avoid smudge occurrence attributed to an inappropriate printing criterion, resulting in improving printing qualities thereafter.

In this configuration, the information output part is configured to further determine whether a backup pin is arranged in a region showing a smudge increase tendency on the board when determining that the frequency of cleaning processes is appropriate, and outputs, to the destination, information to arrange a backup pin in the region and/or around the region as the second information when the backup pin is not arranged in the region.

This configuration can reduce or avoid smudge occurrence attributed to a lack of supportive force of the backup pins for the board, that is, attributed to inappropriateness of the arrangement of the backup pins under an associated criterion among printing criteria.

In this configuration, the information output part outputs, to the destination, information to change a certain criterion of the printing process except a criterion about the arrangement of the backup pins when determining that the back up pin is arranged in the region showing the smudge increase tendency.

This configuration can reduce or avoid smudge occurrence when the smudge is attributed to a certain printing criterion except a printing criterion about the arrangement of the backup pins.

Moreover, the information output part may be configured to determine whether the smudge increase tendency reduces in a result of inspection after the backup pin is arranged on the basis of the second assistive information, and further outputs, to the destination, third assistive information to change a certain criterion of the printing process except a criterion about the arrangement of the backup pins when determining that the smudge increase tendency does not reduce.

In this configuration, it is once inspected whether the smudge is attributed to the arrangement of the backup pins. When it is determined that the smudge is not attributed to the arrangement of the backup pins, information or third assistive information to change a certain criterion of the printing process except the criterion about the backup pins is given to the destination. The configuration hence reliably reduces or avoids smudge occurrence.

In the printing process assistance system, the information output part may be configured to determine appropriateness or inappropriateness of the frequency of cleaning processes on the basis of a smudge tendency in a printing process executed immediately before or substantially immediately before the cleaning process. The information output part may be further configured to determine appropriateness or inappropriateness of the frequency of cleaning processes on the basis of a smudge tendency in a printing process executed at a substantially middle point or thereafter in the cleaning interval.

This configuration enables relatively facilitated and appropriate determination on appropriateness or inappropriateness of the cleaning interval.

The printing process assistance system may further include a storage part that accumulatively stores production criteria for boards produced in past, the production criteria including criteria of the printing process and criteria of the cleaning process; and a production criterion determination part that determines production criteria for a production target board before a start of a printing process for the production target board on the basis of production criteria for a board of the same type as a type of the production target board among the production criteria stored in the storage part. The printing part may start the printing process for the production target board on the basis of the production criteria determined by the production criterion determination part.

In the configuration, production criteria for a production target board are determined on the basis of production criteria for a board of the same type produced in past as the type of the production target board. The configuration thus can effectively reduce smudge occurrence from a start of the printing process of the production target board.

The printing process assistance system may further include a production criterion determination part that determines, on the basis of design information about boards, production criteria including criteria of the printing process and criteria of the cleaning process before a start of production of a production target board. The printing part may start the printing process for the production target board on the basis of the production criteria determined by the production criterion determination part.

This configuration can effectively reduce smudge occurrence from a start of a printing process for a new board.

The invention claimed is:

1. A printing assistance system, comprising:

a printer configured to execute a printing process of printing a paste material onto a board, which is supported by a plurality of backup pins, via openings in a mask by moving the paste material on the mask by a squeegee in a state where the mask overlies the board, and a cleaning process of cleaning a lower surface of the mask a predetermined number of times at a predetermined cleaning interval;

a controller configured to control an operation in each of the printing process and the cleaning process;

an inspection device configured to inspect a level of a smudge of the paste material on the board subjected to the printing process; and a processor configured to output, when a result of the inspection shows continual smudge occurrence, assistive information to reduce the smudge to a destination which is at least one of the controller or a notification part configured to notify an operator of information, wherein the processor is configured to output, to the destination, information to increase a frequency of cleaning processes as the assistive information, and the processor is configured to output the assistive information to the destination on a plurality of occurrences of smudges each having a level exceeding a preset threshold in a predetermined number of cleaning cycles.

2. The printing assistance system according to claim 1, wherein the processor is configured to output, to the destination, information to compulsorily execute a cleaning process on an occurrence of a smudge having a level exceeding the threshold.

3. The printing assistance system according to claim 2, wherein under definition of the assistive information as first assistive information, the processor is configured to output, to the destination, second assistive information to reduce the smudge and change criteria of the printing process when it is determined that the frequency of cleaning processes is appropriate.

4. The printing assistance system according to claim 1, further comprising:

a storage configured to accumulatively store production criteria for boards produced in past, the production criteria including criteria of the printing process and criteria of the cleaning process; and wherein the processor is configured to determine production criteria for a production target board before a start of a printing process for the production target board on the basis of production criteria for a board of the same type as a type of the production target board among the production criteria stored in the storage, wherein the printer is configured to start the printing process for the production target board on the basis of the production criteria determined by the processor.

5. The printing assistance system according to claim 1, wherein the processor is configured to determine, on the basis of design information about boards, production criteria including criteria of the printing process and criteria of the cleaning process before a start of production of a production target board, wherein the printer is configured to start a printing process for the production target board on the basis of the production criteria determined by the processor.

6. The printing assistance system according to claim 1, wherein under definition of the assistive information as first assistive information, the processor is configured to output, to the destination, second assistive information to reduce the smudge and change criteria of the printing process when it is determined that the frequency of cleaning processes is appropriate.

7. A printing assistance system, comprising:

a printer configured to execute a printing process of printing a paste material onto a board, which is supported by a plurality of backup pins, via openings in a mask by moving the paste material on the mask by a squeegee in a state where the mask overlies the board, and a cleaning process of cleaning a lower surface of the mask a predetermined number of times at a predetermined cleaning interval;

a controller configured to control an operation in each of the printing process and the cleaning process;

an inspection device configured to inspect a level of a smudge of the paste material on the board subjected to the printing process; and a processor configured to output, when a result of the inspection shows continual smudge occurrence, assistive information to reduce the smudge to a destination which is at least one of the controller or a notification part configured to notify an operator of information, wherein the processor is configured to output, to the destination, information to increase a frequency of cleaning processes as the assistive information, the processor is configured to determine appropriateness or inappropriateness of the frequency of cleaning processes on the basis of a smudge tendency, and output the assistive information to the destination when determining that the frequency is inappropriate, and under definition of the assistive information as first assistive information, the processor is configured to output, to the destination, second assistive information to reduce the smudge and change criteria of the printing process when it is determined that the frequency of cleaning processes is appropriate.

8. The printing assistance system according to claim 7, wherein the processor is configured to further determine whether a backup pin is arranged in a region showing a smudge increase tendency on the board when determining that the frequency of cleaning processes is appropriate, and output, to the destination, information to arrange a backup pin in the region and/or around the region as the second information when the backup pin is not arranged in the region.

9. The printing assistance system according to claim 8, wherein the processor is configured to output, to the destination, information to change a certain criterion of the printing process except a criterion about the arrangement of the backup pins when determining that the backup pin is arranged in the region showing the smudge increase tendency.

10. The printing assistance system according to claim 8, wherein the processor is configured to determine whether the smudge increase tendency reduces in a result of inspection after the backup pin is arranged on the basis of the second assistive information, and further output, to the destination, third assistive information to change a certain criterion of the printing process except a criterion about the arrangement of the backup pins when determining that the smudge increase tendency does not reduce.

11. The printing assistance system according to claim 7, wherein the processor is configured to determine appropriateness or inappropriateness of the frequency of cleaning processes on the basis of a smudge tendency in a printing process executed immediately before or substantially immediately before the cleaning process.

12. The printing assistance system according to claim 7, wherein the processor is configured to determine appropriateness or inappropriateness of the frequency of cleaning processes on the basis of a smudge tendency in a printing process executed at a substantially middle point or thereafter in the cleaning interval.

13. The printing assistance system according to claim 7, further comprising:

a storage configured to accumulatively store production criteria for boards produced in past, the production criteria including criteria of the printing process and criteria of the cleaning process; and wherein the processor is configured to determine production criteria for a production target board before a start of a printing process for the production target board on the basis of production criteria for a board of the same type as a type of the production target board among the production criteria stored in the storage, wherein the printer is configured to start the printing process for the production target board on the basis of the production criteria determined by the processor.

14. The printing assistance system according to claim 7, wherein the processor is configured to determine, on the basis of design information about boards, production criteria including criteria of the printing process and criteria of the cleaning process before a start of production of a production target board, wherein the printer is configured to start a printing process for the production target board on the basis of the production criteria determined by the processor.

* * * * *